US008936680B2

(12) United States Patent
Katsuno et al.

(10) Patent No.: US 8,936,680 B2
(45) Date of Patent: Jan. 20, 2015

(54) CRUCIBLE VESSEL AND CRUCIBLE COVER HAVING GROOVES FOR PRODUCING SINGLE-CRYSTAL SILICON CARBIDE, PRODUCTION APPARATUS AND METHOD

(75) Inventors: Masakazu Katsuno, Tokyo (JP); Tatsuo Fujimoto, Tokyo (JP); Hiroshi Tsuge, Tokyo (JP); Masashi Nakabayashi, Tokyo (JP)

(73) Assignee: Nippon Steel & Sumitomo Metal Corporation, Tokyo (JP)

( * ) Notice: Subject to any disclaimer, the term of this patent is extended or adjusted under 35 U.S.C. 154(b) by 632 days.

(21) Appl. No.: 13/138,526

(22) PCT Filed: Feb. 25, 2010

(86) PCT No.: PCT/JP2010/053483
§ 371 (c)(1),
(2), (4) Date: Aug. 30, 2011

(87) PCT Pub. No.: WO2010/101200
PCT Pub. Date: Sep. 10, 2010

(65) Prior Publication Data
US 2011/0308449 A1    Dec. 22, 2011

(30) Foreign Application Priority Data

Mar. 6, 2009   (JP) ................................. 2009-052893

(51) Int. Cl.
*C30B 23/02* (2006.01)
*C30B 23/00* (2006.01)
(Continued)

(52) U.S. Cl.
CPC ............ *C30B 29/36* (2013.01); *H01L 21/02433* (2013.01); *H01L 21/02529* (2013.01); *C30B 23/005* (2013.01); *H01L 21/02378* (2013.01)
USPC .............................. 117/84; 117/109; 117/200

(58) Field of Classification Search
CPC .......... C30B 23/00; C30B 23/02; C30B 23/06
USPC .................... 117/84, 109, 200, 911, 937, 951
See application file for complete search history.

(56) References Cited

U.S. PATENT DOCUMENTS 6,048,813 A    4/2000   Hunter
6,451,112 B1   9/2002   Hara et al.
(Continued)

FOREIGN PATENT DOCUMENTS

JP   06-298594      10/1994
JP   2001-114599    4/2001
(Continued)

OTHER PUBLICATIONS

Yu.M. Tairov, et al. publication entitled "General principles of growing large-size single crystals of various silicon carbide polytypes," Journal of Crystal Growth, vol. 52, pp. 146-150 (1981).*

(Continued)

*Primary Examiner* — Kenneth A Bratland, Jr.
(74) *Attorney, Agent, or Firm* — Kenyon & Kenyon LLP

(57) ABSTRACT

The present invention, which provides a crucible for producing single-crystal silicon carbide, and a production apparatus and a production method for single-crystal silicon carbide, which are capable of stably growing a single-crystal silicon carbide ingot good in crystallinity at high yield, is a crucible for producing single-crystal silicon carbide having a crucible vessel for holding silicon carbide raw material and a crucible cover for attaching a seed crystal and is adapted to sublimate a silicon carbide raw material in the crucible vessel to supply silicon carbide sublimation gas onto a seed crystal attached to the crucible cover and grow single-crystal silicon carbide on the seed crystal, which crucible for producing single-crystal silicon carbide is provided in the crucible vessel and the crucible cover with threaded portions to be screwed together and is provided with a sublimation gas discharge groove or grooves capable of regulating flow rate by relative rotation of the threaded portions; and is a production apparatus for single-crystal silicon carbide equipped with such a crucible and a production method for single-crystal silicon carbide utilizing this apparatus.

6 Claims, 9 Drawing Sheets

(51) Int. Cl.
*C30B 29/36* (2006.01)
*H01L 21/02* (2006.01)

(56) References Cited

U.S. PATENT DOCUMENTS

2004/0050320 A1* 3/2004 Maruyama et al. ............ 117/84
2008/0026546 A1   1/2008 Kordina et al.

FOREIGN PATENT DOCUMENTS

| JP | 2002-527343 | 8/2002 |
|----|-------------|--------|
| JP | 2002-255693 | 9/2002 |
| JP | 2005-336010 | 12/2005 |
| JP | 2007-230846 | 9/2007 |
| JP | 2008-115033 | 5/2008 |

OTHER PUBLICATIONS

International Search Report dated Jun. 15, 2010 issued in corresponding PCT Application No. PCT/JP2010/053483.
Yu. M. Tairov and V. F. Tsvetkov, "General Principles of Growing Large-Size Single Crystals of Various Silicon Carbide Polytypes" Journal of Crystal Growth, vol. 52 (1981) pp. 146-150.
European Search Report dated Jul. 25, 2013 issued in corresponding EP Application No. 10 74 8793.

* cited by examiner

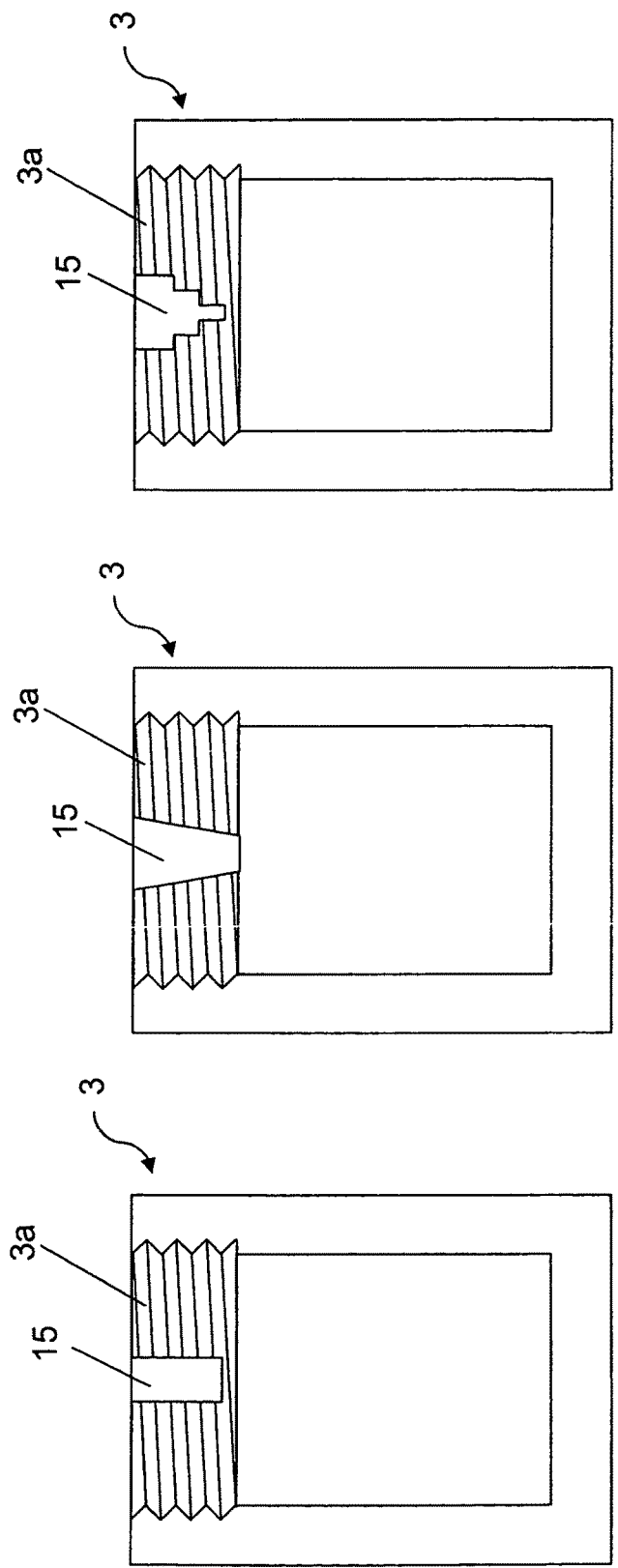

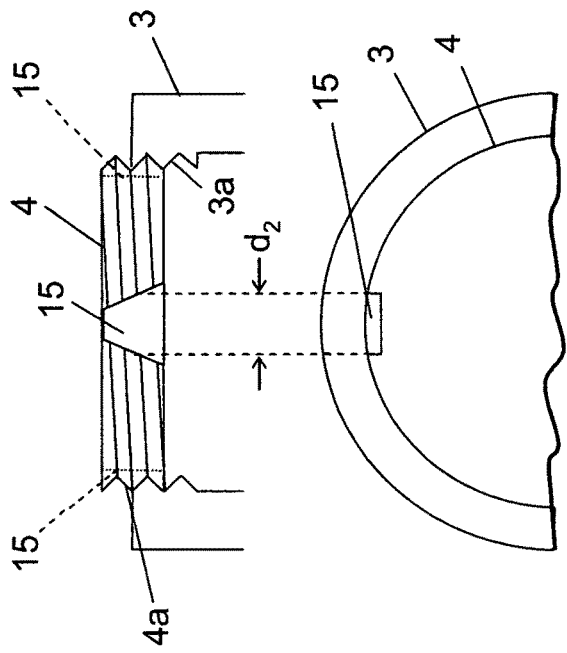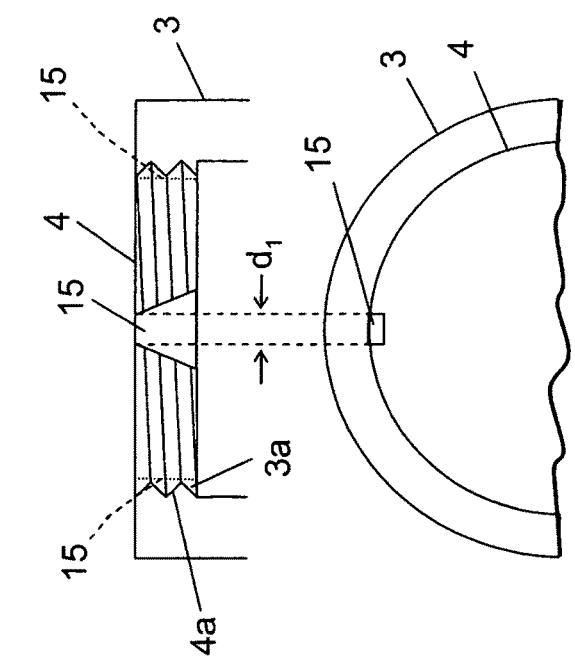

CRUCIBLE VESSEL AND CRUCIBLE COVER HAVING GROOVES FOR PRODUCING SINGLE-CRYSTAL SILICON CARBIDE, PRODUCTION APPARATUS AND METHOD

This application is a national stage application of International Application No. PCT/JP2010/053483, filed 25 Feb. 2010, which claims priority to Japanese Application Nos. 2009-052893, filed 6 Mar. 2009, which is incorporated by reference in its entirety.

FIELD OF THE INVENTION

This invention relates to a crucible for producing single-crystal silicon carbide by sublimating a silicon carbide material to grow single-crystal silicon carbide on a seed crystal, and a production apparatus and a production method for single-crystal silicon carbide.

BACKGROUND ART

Owing to such physical and chemical properties as outstanding heat resistance and mechanical strength, as well as strength against radiation, silicon carbide (SiC) has attracted attention as an environmentally rugged semiconductor material. However, SiC is a typical substance having a polytype structure that assumes numerous different crystal structures even though the chemical composition is the same. Where the molecules of bonded Si and C in the crystal structure are thought of as units, the polytypes occur because the periodic structure varies when these molecular structure units stack in the C-axis direction ([0001] direction of the crystal. The typical polytypes here are 6H, 4H, 15R and 3C, where the initial numeral indicates the stacking sequence period and the alphabetic character represents the crystal system (H for hexagonal system, R for rhombohedral system, and C for cubic system). Moreover, the individual polytypes differ in physical and electrical characteristics, and various applications are devised using these differences.

Single-crystal SiC of a size enabling fabrication of semiconductor devices has up to now been obtained on a laboratory scale by, for example, using the sublimation recrystallization method (Lely process) to grow single-crystal SiC. However, the area of the single crystal obtained by this method is small and its size and shape are hard to control with high accuracy. Further, the polytype and impurity carrier density possessed by the SiC is also not easy to control.

Further, growth of cubic single-crystal SiC is conducted by using the chemical vapor deposition method (CVD method) to heteroepitaxially grow silicon (Si) or the like on a foreign substrate. However, while large-area single crystal can be obtained by this method, high-quality single-crystal SiC cannot be readily obtained because only single-crystal SiC containing many defects (up to $10^7$ cm$^{-2}$) can be grown since, inter alia, the lattice mismatch with the substrate is as large as around 20%.

Therefore, in order to resolve these difficulties, the modified Lely process, which conducts sublimation recrystallization using a single-crystal SiC [0001] oriented substrate, was proposed (Non-patent Document 1). This sublimation recrystallization method is a method of producing SiC crystal by sublimating SiC powder at a high temperature above 2000° C. and recrystallizing the sublimation gas in a low-temperature region, which is called the modified Lely process and used especially for producing bulk single-crystal SiC. And since a seed crystal is used in the modified Lely process, the crystal nucleation process can be controlled, and by using an inert gas to control the ambient pressure to about 100 Pa to 15 kPa, the crystal growth rate and the like can be controlled with good reproducibility.

Here, by way of explaining the modified Lely process, single-crystal SiC constituting a seed crystal whose crystal growth surface is the [0001] plane and single-crystal SiC powder constituting the raw material (one obtained by washing and preprocessing an abrasive produced by the Acheson method is ordinarily used) are, as shown in FIG. 8, placed in a crucible (although usually made of graphite, a material other than graphite, such as a high-melting-point material, graphite-coated high-melting-point material, or graphite coated with high-melting-point material, is sometimes used partially) and heated to 2000 to 2400° C. in an argon or other inert gas atmosphere (133 Pa to 13.3 kPa). At this time, the temperature gradient is established so that the seed crystal is somewhat lower in temperature than the raw material powder (e.g., 100 to 200° C. lower). After sublimation, the raw material is diffused and conveyed toward the seed crystal by the density gradient (formed by the temperature gradient). Single crystal growth is realized by recrystallization on the seed crystal of the raw material gas arriving at the seed crystal. At this time, addition of impurity gas into atmosphere consisting of inert gas or mixing of an impurity element or a compound thereof with the SiC raw material powder enables the volume resistivity of the crystal to control the substitution (doping) of an impurity element at the position of a silicon or carbon atom in the single crystal SiC structure. Among the typical substitutional impurities in the single-crystal SiC here are nitrogen (n 25 type), boron, and aluminum (p type). Single-crystal SiC can be grown while using these impurities to control the carrier type and density. Single-crystal SiC wafers of 2-inch (50.8 mm) to 4-inch (100 mm) diameter are currently being cut from single-crystal SiC produced by the aforesaid Lely process and utilized for epitaxial film growth and device fabrication.

As set out above, in the modified Lely process, raw material sublimated at high temperature in a graphite crucible is diffused by a density gradient formed by a temperature gradient and conveyed onto a seed crystal where it is recrystallized to grow single-crystal SiC. During crystal growth, therefore, the effect exerted on crystal growth by the flow of sublimation gas in the crucible is large. So, with the aim of controlling the gas flow rate so as to collect the sublimation gas generated from the raw material at the seed crystal substrate, cases have been reported, in Patent Document 1 for example, of providing a conical flange at the seed crystal attachment region.

PRIOR ART REFERENCES

Patent Document

Patent Document 1 Unexamined Patent Publication (Kokai) No. 2007-230846

Non-Patent Document

Non-patent Document 1 Yu. M. Tairov and V. F. Tsvetkov, Journal of Crystal Growth, vol. 52 (1981) pp. 146-150.

SUMMARY OF THE INVENTION

Problem to be Solved by the Invention

In this regard, 6H polytype single-crystal SiC, for example, has in recent years been used as a substrate for blue to ultraviolet short-wavelength optoelectronic devices, and 4H polytype single-crystal SiC is being considered for application as a substrate wafer for high-frequency, high-breakdown-voltage electronic devices, so that a need has come to be felt also with regard to such SiC single-crystals for ones having larger area and higher quality.

However, no crystal growth technology capable of stably supplying such high quality single-crystal SiC of large area on an industrial scale has yet been established. Therefore, practical use of SiC has been thwarted, notwithstanding that it is a semiconductor material having numerous merits and possibilities such as mentioned above.

So the present inventors first studied the cause hindering stable production of high-quality single-crystal SiC of large area on an industrial scale and determined the following fact as a result.

Specifically, when crystal growth is actually conducted in the aforesaid modified Lely process, crystal of substantially the same diameter as the seed crystal grows on the seed crystal at the initial stage (see FIG. 9(a)), but owing to the effect of the temperature gradient inside the crucible, the temperature gradient is imparted sideways at the same time as forward to become a driving force, so that the diameter of the crystal tends to expand gradually together with growth (see FIG. 9(b)). As this tendency continues throughout the crystal growth time, the distance between the inner wall of the crucible and the grown crystal gradually narrows, which has the effect of reducing the flow of sublimation gas at the periphery of the grown crystal. The region charged with raw material is similarly heated at this time and a certain amount of raw material sublimation gas corresponding to this heating is generated and diffuses toward the grown crystal, with the result that the sublimation gas flow rate at the peripheral region toward the grown crystal center region that is the growth front, i.e., the vicinity of the flat surface at the atomic level often called the facet region. As a result, growth of the crystal is frequently disturbed near the facet, so that a polytype structure different from the seed crystal is produced and micropipe (large spiral dislocation with hollow dislocation core) defects and polycrystallization occur to markedly degrade crystallinity.

Moreover, this tendency also arises in the case of using a crucible equipped with a conical flange like that in Patent Document 1, and growth therefore becomes unstable from midway to the latter half of the crystal growth process to give rise to a problem of frequent crystal quality degradation owing to inclusion of foreign polytypes.

In the sublimation recrystallization process (specifically the aforesaid modified Lely process), the present inventors controlled the change in flow of sublimation gas caused by gradual expansion of the grown crystal toward the crucible wall with time and conducted an assiduous study with respect to a crucible for producing single-crystal silicon carbide, and a production apparatus and a production method for single-crystal silicon carbide, which can use this control to obtain single-crystal silicon carbide good in crystallinity, whereby they achieved the present invention by attaining a new crucible structure enabling control of the flow of sublimation gas flow at the peripheral region of the grown crystal and by further discovering that the problem in the conventional sublimation recrystallization process can be resolved by using this new-structure crucible to control sublimation gas flow at the grown crystal peripheral region, most preferably by controlling the sublimation gas flow so that the sublimation gas flow rate at the grown crystal peripheral region increases gradually little by little.

Therefore, the object of the present invention is to overcome the aforesaid problem of the prior art and provide a crucible for producing single-crystal silicon carbide, and a production apparatus and a production method for single-crystal silicon carbide, that enable single-crystal silicon carbide of good crystallinity to be stably produced on an industrial scale at relatively large area.

Means for Solving the Problem

Specifically, the present invention is constituted as follows:

(1) A crucible for producing single-crystal silicon carbide that has a crucible vessel for holding silicon carbide raw material and a crucible cover for attaching a seed crystal and is adapted to sublimate a silicon carbide raw material in the crucible vessel to supply silicon carbide sublimation gas onto a seed crystal attached to the crucible cover and grow single-crystal silicon carbide on the seed crystal, which crucible for producing single-crystal silicon carbide is characterized in that the crucible vessel and the crucible cover are provided with threaded portions to be screwed together and the threaded portion of the crucible vessel and/or the crucible cover is provided with a sublimation gas discharge groove or grooves capable of regulating flow rate by relative rotation of the threaded portions.

(2) A crucible for producing single-crystal silicon carbide as set out in (1) above, characterized in that the sublimation gas discharge groove or grooves provided in the threaded portion of the crucible vessel and/or crucible cover are formed so that their opening area changes gradually from the groove outlet side to the groove inlet side.

(3) A crucible for producing single-crystal silicon carbide as set out in (1) or (2), characterized in that the sublimation gas discharge groove or grooves provided in the threaded portion of the crucible vessel and/or crucible cover open along the circumferential direction of the threaded portion and the total length of the longest portion(s) of the opening width thereof is not less than ¼ to not greater than 9/10 the threaded portion perimeter length.

(4) A production apparatus for single-crystal silicon carbide equipped with a crucible that has a crucible vessel for holding silicon carbide raw material and a crucible cover for attaching a seed crystal and is adapted to sublimate a silicon carbide raw material in the crucible vessel to supply silicon carbide sublimation gas onto a seed crystal attached to the crucible cover and grow single-crystal silicon carbide on the seed crystal, which production apparatus for single-crystal silicon carbide is characterized in that the crucible vessel and the crucible cover are provided with threaded portions to be screwed together and the threaded portion of the crucible vessel and/or the crucible cover is provided with a sublimation gas discharge groove or grooves capable of regulating flow rate by relative rotation of the threaded portions, and the crucible vessel and/or crucible cover is provided with threaded portion drive means for imparting relative rotation to the threaded portions.

(5) A production method for single-crystal silicon carbide that uses the production apparatus for single-crystal silicon carbide of (4) to sublimate a silicon carbide raw material contained in the crucible vessel, thereby supplying silicon carbide sublimation gas onto a seed crystal attached to the crucible cover and growing single-crystal silicon carbide on the seed crystal, which production method for single-crystal silicon carbide is characterized in growing single-crystal silicon carbide while varying the discharge rate of sublimation gas to outside the crucible during the single-crystal silicon carbide growth process.

(6) A production method for single-crystal silicon carbide as set out in (5), wherein the discharge rate of sublimation gas to outside the crucible is controlled to increase gradually in pace with crystal growth.

The crucible configuration here can be any configuration insofar as it has the crucible vessel for holding silicon carbide powder raw material and the crucible cover to which the seed crystal is attached and it enables threaded portions that can be imparted with relative rotation to be formed between the crucible vessel and crucible cover, but preferably, as regards dissipation of heat from the crucible to the exterior, a cylindrical shape is optimum because it excels in uniformity of circumferential heat dissipation.

Further, as regards the threaded portions provided for screwing the crucible vessel and crucible cover together, it is possible, depending on the shapes of the crucible vessel and crucible cover, either to form a female threaded portion on the crucible vessel side and form a male threaded portion on the crucible cover side or, to the contrary, form a male threaded portion on the crucible vessel side and form a female threaded portion on the crucible cover side, and for example, in the case of a crucible in which a disk-shaped crucible cover is screwed into the top opening of a crucible vessel with a cylindrical top opening, it is better to form a female threaded portion in the inner surface of the crucible vessel upper opening and form a male threaded portion on the perimeter of the crucible cover, while in the case of a crucible in which a crucible cover having a flange on its perimeter is placed on top of a crucible vessel with a cylindrical top opening and screw-fitted therewith, a female threaded portion is formed in the inner surface of the flange of the crucible cover and a male threaded portion is formed on the outside of the top of the crucible vessel.

In addition, as regards the sublimation gas discharge groove or grooves formed in the threaded portions between the crucible vessel and the crucible cover, it suffices to form grooves that enable flow rate regulation by relative rotation of the threaded portions of the crucible vessel and crucible cover, and they can be formed only in the threaded portion of the crucible vessel, be formed only in the threaded portion of the crucible cover, or be formed in both the threaded portion of the crucible vessel and the threaded portion of the crucible cover to constitute grooves that cooperatively enable flow rate regulation. The sublimation gas discharge grooves enabling flow rate regulation by relative rotation of threaded portions as termed here are sublimation gas discharge grooves that control the flow or flow rate of sublimation gas discharged from inside to outside the crucible through the discharge grooves by relatively rotating the threaded portions to open and close the discharge grooves or by relatively rotating the threaded portions to vary the opening area of the discharge grooves.

And as regards the machining of the sublimation gas discharge grooves, it is efficient from the aspect of fabrication to grind away the screw ridge (valley), but it is also possible to grind to a depth greater than the screw ridge (valley) or to grind away only part of the screw ridge peak so as to leave the base of the screw ridge (valley). Although the pitch and thread height of the threaded portions of the crucible vessel and crucible cover formed with the sublimation gas discharge grooves are not particularly limited and can be defined in accordance with the size of the crucible, the pitch is preferably 1 to 3 mm and the height of the thread is preferably 0.3 to 2 mm. And as regards the shape of the sublimation gas discharge grooves formed in the threaded portions, it suffices if the discharge grooves can be opened and closed or the opening area thereof can be varied by relatively rotating the crucible cover and the crucible vessel and any shape is acceptable, but one that enables the flow or flow rate of the sublimation gas to be increased little by little is preferable, so that a shape whereby the circumferential direction width dimension or depth dimension of the grooves changes gradually in the axial direction of the threaded portion is preferable. Further, as regards the number of sublimation gas discharge groove formation sites, although at least one site suffices, three or more sites is preferable from the viewpoint of making the rate of sublimation gas discharge from the grown crystal peripheral region uniform, while not more than 20 sites is better from the viewpoint of crucible cover fabrication.

Effect of the Invention

In the production of single-crystal silicon carbide by sublimating a silicon carbide raw material to grow silicon carbide crystal on a seed crystal, the present invention makes it possible to control the turbulence and flow rate of the sublimation gas flow in the crystal growth process, thereby making it possible to prevent occurrence of various defects caused by such sublimation gas turbulence and flow rate fluctuation and enabling growth of SiC single crystal good in crystallinity at high yield.

BRIEF DESCRIPTION OF THE DRAWING

FIG. 5(a) is a cross-sectional explanatory view of a crucible vessel for explaining sublimation gas discharge grooves provided in a female threaded portion of the crucible vessel of a crucible for producing single-crystal silicon carbide according to fourth to sixth embodiments of the present invention.

FIG. 5(b) is a cross-sectional explanatory view of a crucible vessel for explaining sublimation gas discharge grooves provided in a female threaded portion of the crucible vessel of a crucible for producing single-crystal silicon carbide according to the fourth to sixth embodiments of the present invention.

FIG. 5(c) is a cross-sectional explanatory view of a crucible vessel for explaining sublimation gas discharge grooves provided in a female threaded portion of the crucible vessel of a crucible for producing single-crystal silicon carbide according to the fourth to sixth embodiments of the present invention.

FIG. 7(a) is an explanatory view showing how, when using the crucible for producing single-crystal silicon carbide of the second embodiment shown in FIG. 3, the opening area (opening width) of a sublimation gas discharge groove formed between the crucible vessel and crucible cover changes when the crucible cover is rotated, and showing the position of the crucible cover at the start of growth and a sublimation gas discharge groove established between the crucible vessel and crucible cover.

FIG. 7(b) is an explanatory view showing how, when using the crucible for producing single-crystal silicon carbide of the second embodiment shown in FIG. 3, the opening area (opening width) of a sublimation gas discharge groove formed between the crucible vessel and crucible cover changes when the crucible cover is rotated, and showing the position of the crucible cover when the crucible cover is rotated midway of the growth and a sublimation gas discharge groove established between the crucible vessel and crucible cover.

MODES FOR CARRYING OUT THE INVENTION

Modes for carrying out the present invention are concretely explained below based on the embodiments shown in the attached drawings, examples, and comparative examples.

First Embodiment

First, a crucible A for producing single-crystal silicon carbide according to a first embodiment of the present invention is shown in FIG. 1, FIG. 2(a), FIG. 2(b) and FIG. 2(c): The crucible A is constituted of a crucible vessel 3 with a cylindrical top opening and a disk-shaped crucible cover 4, the inside surface of the top opening of the crucible vessel 3 and the periphery of the crucible cover 4 are formed with a female threaded portion 3a and a male threaded portion 4a, respectively, and threaded portions for screw engagement are constituted by the female threaded portion 3a of the crucible vessel 3 and the male threaded portion 4a of the crucible cover 4.

Figure 1:
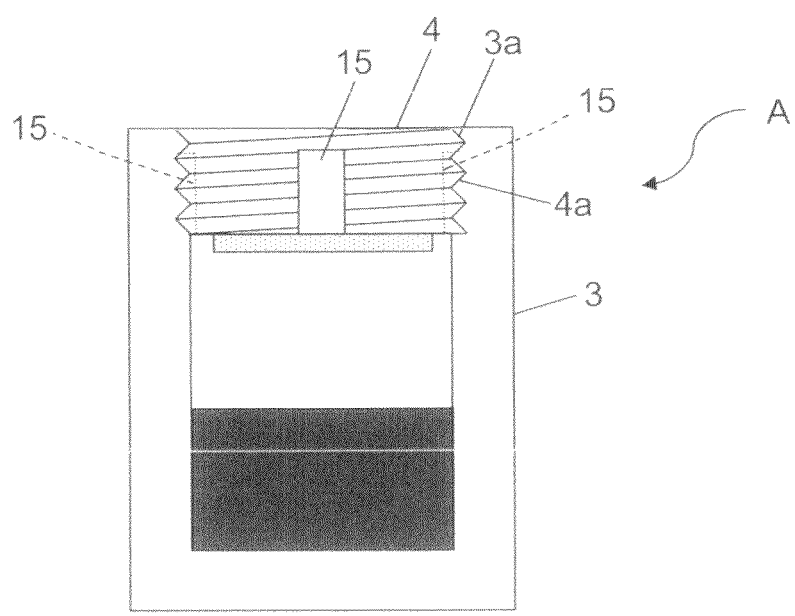
FIG. 1 is a cross-sectional explanatory view showing the structures of the crucible vessel and crucible cover of a crucible for producing single-crystal silicon carbide according to a first embodiment of the present invention.
Figure 2A:
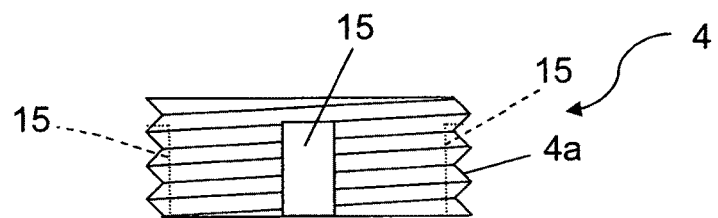
FIG. 2(a) is side explanatory view of the crucible cover for explaining sublimation gas discharge grooves provided in a threaded portion of the crucible cover of FIG. 1.
Figure 2B:
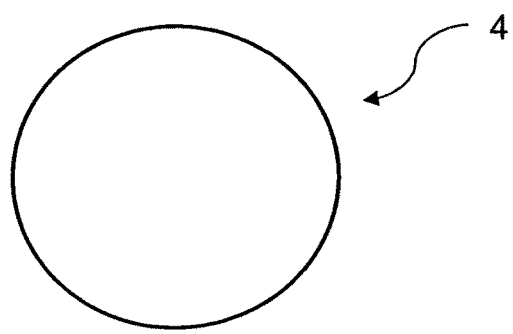
FIG. 2(b) is a top explanatory view of the crucible cover for explaining the sublimation gas discharge grooves provided in a threaded portion of the crucible cover of FIG. 1.
Figure 2C:
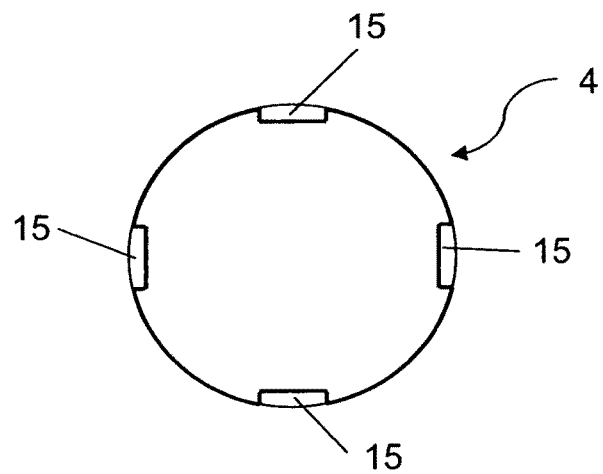
FIG. 2(c) is a bottom explanatory view of the crucible cover for explaining the sublimation gas discharge grooves provided in the threaded portion of the crucible cover of FIG. 1.

And in the first embodiment, as plainly indicated in FIG. 2(a), FIG. 2(b) and FIG. 2(c), the male threaded portion 4a of the crucible cover 4 is formed at four sites equally spaced in the circumferential direction thereof with sublimation gas discharge grooves 15 at positions below portions of the screw ridge left intact at the upper portion in the axial direction. And these sublimation gas discharge grooves 15 are formed in the axial direction of the male threaded portion 4a of the crucible cover 4 to a size whose depth dimension exceeds the height of the screw ridge, with no change in the width dimension in the circumferential direction of the crucible cover 4.

Therefore, according to the crucible A for producing single-crystal silicon carbide indicated by the first embodiment, the sublimation gas discharge grooves 15 at the aforesaid four sites are completely closed by the screw ridge of upper part of the male threaded portion 4a of the crucible cover 4 in the state where the male threaded portion 4a of the crucible cover 4 is fully engaged in the female threaded portion 3a of the crucible vessel 3, and when, in the course of the single-crystal silicon carbide growth process, the male threaded portion 4a of the crucible cover 4 is gradually rotated relative to the female threaded portion 3a of the crucible vessel 3 to raise it to where the sublimation gas discharge grooves 15 are formed, the sublimation gas discharge grooves 15 formed in the male threaded portion 4a of the crucible cover 4 are exposed from the groove outlets at their upper ends to open to the outside of the crucible A, whereby the sublimation gas discharge grooves 15, which have opening areas of a prescribed size commensurate with their circumferential direction dimension and depth dimension, come to communicate from the inside to the outside of the crucible A.

Second Embodiment

Figure 3A:
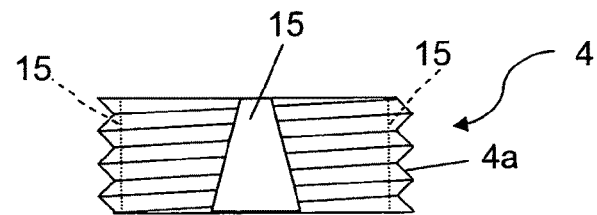
FIG. 3(a) is a side explanatory view of a crucible cover for explaining sublimation gas discharge grooves provided in a male threaded portion of the crucible cover of a crucible for producing single-crystal silicon carbide according to a second embodiment of the present invention.
Figure 3B:
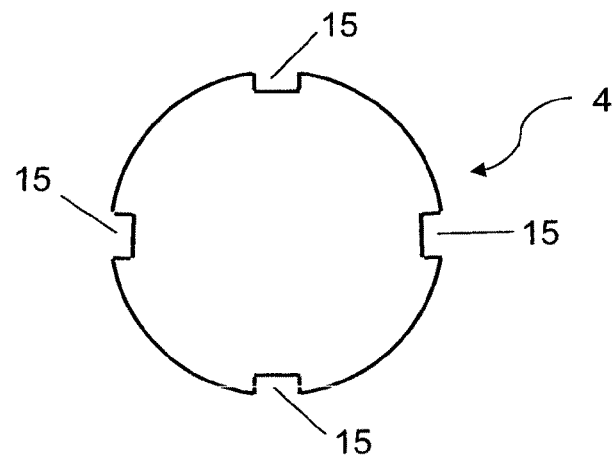
FIG. 3(b) is a top explanatory view of the crucible cover for explaining sublimation gas discharge grooves provided in the male threaded portion of the crucible cover of the crucible for producing single-crystal silicon carbide according to the second embodiment of the present invention.
Figure 3C:
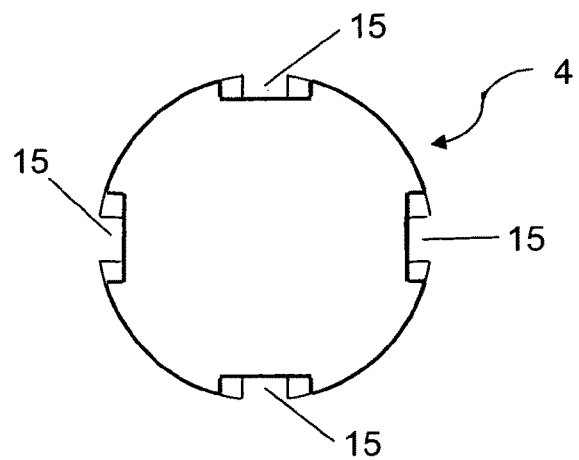
FIG. 3(c) is a bottom explanatory view of the crucible cover for explaining sublimation gas discharge grooves provided in the male threaded portion of the crucible cover of the crucible for producing single-crystal silicon carbide according to the second embodiment of the present invention.

Next, a crucible cover 4 of a crucible for producing single-crystal silicon carbide according to a second embodiment of the present invention is shown in FIG. 3(a), FIG. 3(b) and FIG. 3(c): Sublimation gas discharge grooves 15 are formed on a male threaded portion 4a of the crucible cover 4 at four sites equally spaced in the circumferential direction thereof and the sublimation gas discharge grooves 15 are formed by cutting to a prescribed depth dimension exceeding the height dimension of the screw ridge and so as to increase gradually in width dimension downwardly from the top end to the bottom end in the axial direction of the male threaded portion 4a of the crucible cover and 4. As a result, when the crucible cover 4 is fully screw-engaged inside a crucible vessel 3, the groove outlets and groove inlets of the sublimation gas discharge grooves 15 respectively come to open at their top ends in the axial direction of the male threaded portion 4a of the crucible cover 4 and their bottom ends in the axial direction of the male threaded portion 4a in accordance with the width dimension in the circumferential direction and the depth dimension of the notch of the sublimation gas discharge grooves 15 formed in the male threaded portion 4a of the crucible cover 4.

Therefore, in the crucible for producing single-crystal silicon carbide of the second embodiment, when the crucible cover 4 is rotated to gradually raise the crucible cover 4 relative to the crucible vessel 3, the groove circumferential direction dimension of the groove outlets of the sublimation gas discharge grooves 15 formed between the crucible cover 4 and crucible vessel 3 increases, whereby the opening area the sublimation gas discharge grooves 15 increases progressively so that the discharge rate of the sublimation gas can be continuously varied.

Third Embodiment

Figure 4A:
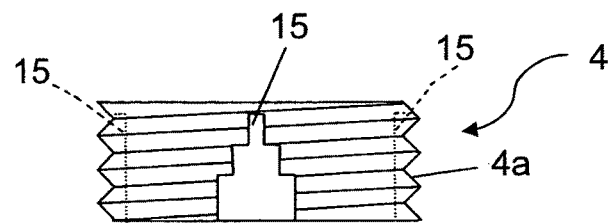
FIG. 4(a) is a side explanatory view of a crucible cover for explaining sublimation gas discharge grooves provided in a male threaded portion of the crucible cover of a crucible for producing single-crystal silicon carbide according to a third embodiment of the present invention.
Figure 4B:
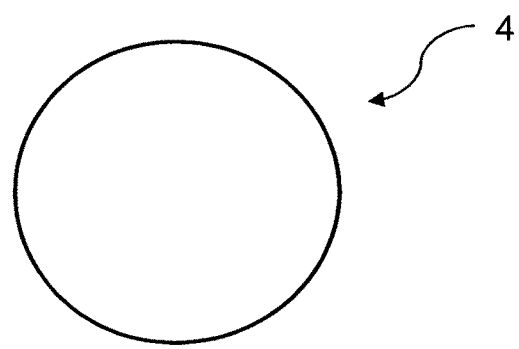
FIG. 4(b) is a top explanatory view of the crucible cover for explaining sublimation gas discharge grooves provided in the male threaded portion of the crucible cover of the crucible for producing single-crystal silicon carbide according to the third embodiment of the present invention.
Figure 4C:
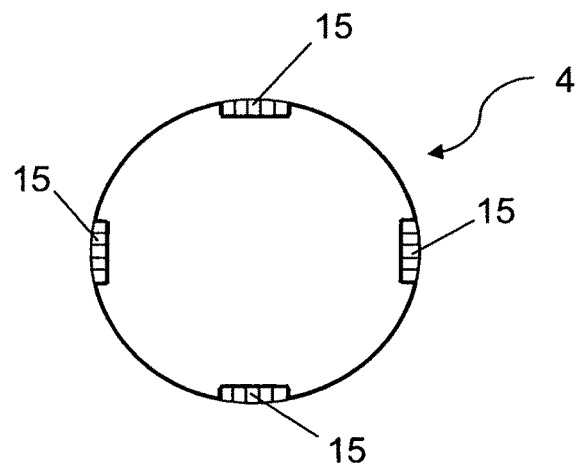
FIG. 4(c) is a bottom explanatory view of the crucible cover for explaining sublimation gas discharge grooves provided in the male threaded portion of the crucible cover of the crucible for producing single-crystal silicon carbide according to the third embodiment of the present invention.

In addition, a crucible cover 4 of a crucible for producing single-crystal silicon carbide according to a third embodiment of the present invention is shown in FIG. 4(a), FIG. 4(b) and FIG. 4(c). In this third embodiment, differently from in the case of the foregoing second embodiment, sublimation gas discharge grooves 15 are formed on a male threaded portion 4a of the crucible cover 4 at four sites by cutting away the screw thread below a position above which the screw thread is left intact so that the their width dimension increases stepwise from above to below in the axial direction of the crucible cover 4. Also in this third embodiment, similarly to in the case of the aforesaid first embodiment and second embodiment, the discharge rate of the sublimation gas can be varied stepwise by rotating the crucible cover 4 to gradually raise the crucible cover 4 relative to the crucible vessel 3.

Fourth to Sixth Embodiments

Further, in FIG. 5 (a), FIG. 5 (b) and FIG. 5(c) are shown crucible vessels 3 for producing single-crystal silicon carbide according to fourth to sixth embodiments of the present invention (although only one of the sublimation gas discharge grooves 15 is shown in FIG. 5 (a), FIG. 5 (b) and FIG. 5(c): Sublimation gas discharge grooves 15 like those in the case of the aforesaid first to third embodiments are, differently from in the case of the aforesaid first to third embodiments, provided on the crucible vessel 3 female threaded portion 3a side at four sites in the circumferential direction thereof, where FIG. 5(a) is a case in which sublimation gas discharge grooves 15 like those in the first embodiment are formed on the female threaded portion 3a of the crucible vessel 3, FIG. 5(b) is 5(c) is a case in which sublimation gas discharge grooves 15 like those in the second embodiment are formed on the female threaded portion 3a of the crucible vessel 3, and 5(c) is a case in which sublimation gas discharge grooves 15 like those in the third embodiment are formed on the female threaded portion 3a of the crucible vessel 3, and also in the fourth to sixth embodiments, similarly to in the case of the first to third embodiments, respectively, the opening area of the sublimation gas discharge grooves 15 can be increased to continuously vary the flow and flow rate of the sublimation gas flowing in the sublimation gas discharge grooves 15.

Seventh Embodiment

Next, a production apparatus and a production method for single-crystal silicon carbide using the crucible for producing single-crystal silicon carbide of the present invention will be explained based on FIG. 6, FIG. 7(a) and FIG. 7(b) (although only one of the sublimation gas discharge grooves 15 at the four sites is shown in FIG. 7(a) and FIG. 7(b)).

Figure 6:
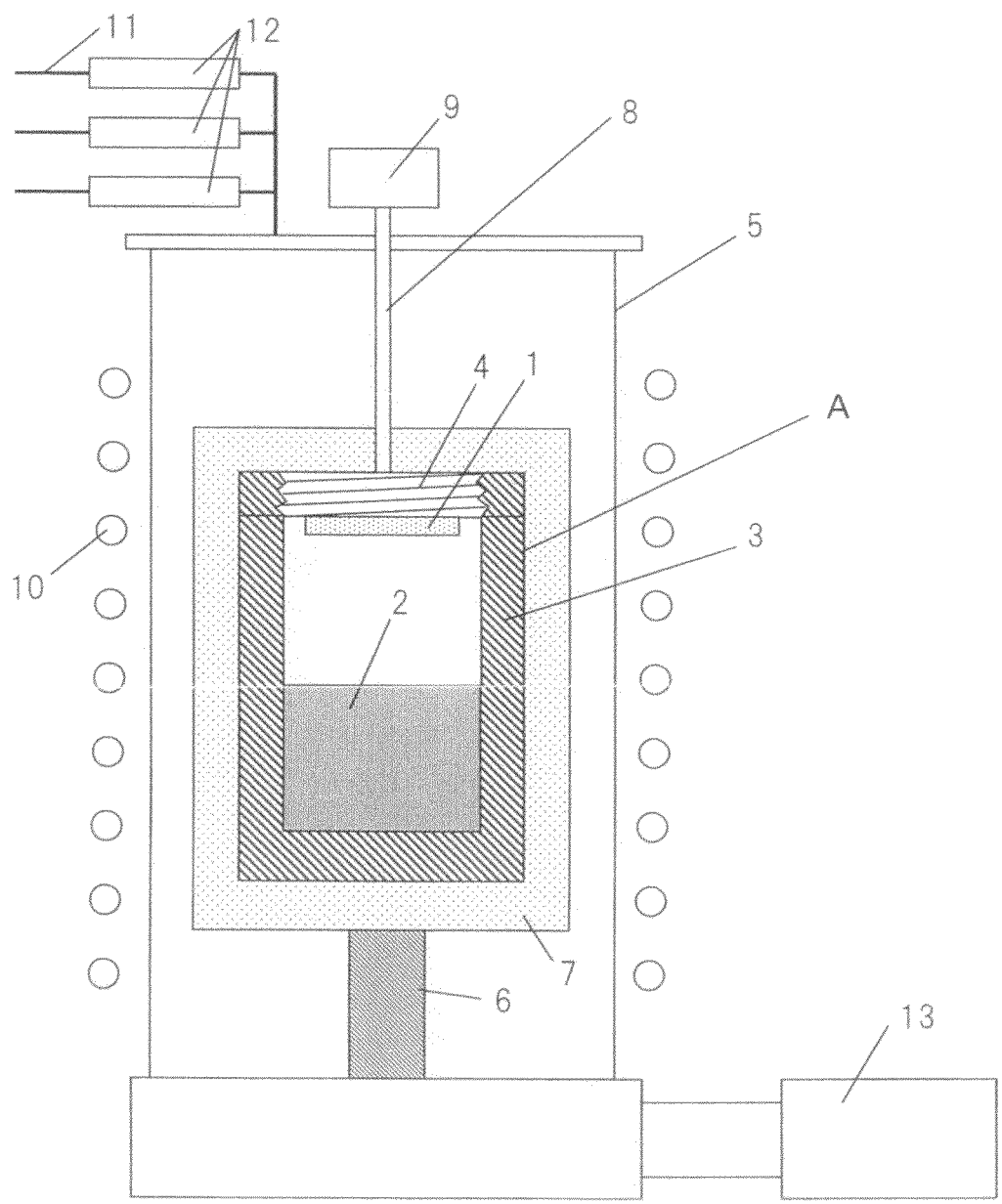
FIG. 6 is a schematic explanatory view for explaining a production apparatus for single-crystal silicon carbide according to a seventh embodiment of the present invention.
Figure 8:
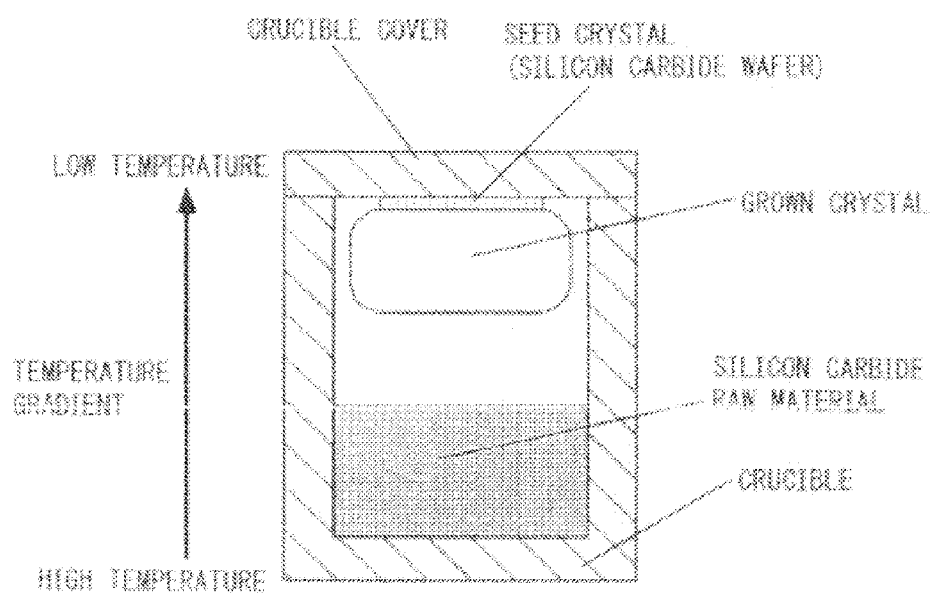
FIG. 8 is an explanatory view for explaining the modified Lely process.

In FIG. 6 is shown an overview of a production apparatus for single-crystal silicon carbide according to a seventh embodiment that is equipped with a crucible A of the present invention (the crucible A is formed in the crucible vessel 3 and/or crucible cover 4 with unshown sublimation gas discharge grooves as shown in the aforesaid first to sixth embodiments). In this production apparatus, the graphite crucible A is deployed inside a double-walled quartz tube 5 by a support rod 6, a graphite thermal insulation material (graphite felt) 7 for heat shielding is installed therearound, a work coil 10 for heating the crucible A by application of high-frequency current is installed around the double-walled quartz tube 5, and the double-walled quartz tube 5 is equipped with gas piping 11 for introducing argon (Ar) gas into the double-walled quartz tube 5 through a gas flow rate regulator 12 and with an evacuator 13 for evacuating the interior of the double-walled quartz tube 5 to a high vacuum.

And in the seventh embodiment, in order to impart rotation to the crucible cover 4 for imparting relative rotation to the threaded portions formed on the crucible vessel 3 and/or the crucible cover 4 of the crucible A, there is attached to the crucible cover 4 a carbon shaft 8 for rotational driving (threaded portion drive means) whose one end is fixed to the center of the upper surface of the crucible cover 4 and whose other end is connected to a drive motor 9 (threaded portion drive means) installed outside the double-walled quartz tube 5.

Therefore, in accordance with the production apparatus for single-crystal silicon carbide of the seventh embodiment, raw material silicon carbide crystal powder (SiC crystal powder) 2 is received in the crucible vessel 3 of the crucible A, single-crystal silicon carbide (single-crystal SiC) 1 formed into disk-like shape is attached to the bottom surface of the crucible cover 4 as seed crystal, and the SiC crystal powder 2 is sublimated by heating and the generated sublimation gas is grown on the single-crystal SiC 1 to produce single-crystal silicon carbide by the modified Lely process, but to explain here taking as an example the case where the crucible A used is one set out in the second embodiment shown in FIG. 3(a), FIG. 3(b) and FIG. 3(c), at the start of crystal growth, the male threaded portion 4a of the crucible cover 4 is screwed fully into the female threaded portion 3a of the crucible vessel 3, as shown in FIG. 7(a), so that the circumferential direction width dimension (d1) of the groove outlets of the sublimation gas discharge grooves 15 formed between the crucible cover 4 and crucible vessel 3 becomes minimum (see FIG. 7(a)), with the result that sublimation of the silicon carbide starts in the state of minimum opening area of the sublimation gas discharge grooves 15, and after the crystal growth has started, the drive motor 9 of the threaded portion drive means is operated gradually in pace as the crystal grows to rotate the rotational driving shaft 8 of the threaded portion drive means very slowly, e.g., at the rate of ¼ turn per hour, to slowly raise the crucible cover 4 relative to the crucible vessel 3 so that the crucible cover 4 is rotated in the direction of withdrawing from the crucible vessel 3, whereby the circumferential direction dimension (d2) of the sublimation gas discharge grooves 15 enlarges gradually, as shown in FIG. 7(b), to gradually enlarge the opening area of the groove outlets, thus making it possible to increase the sublimation gas flow rate (discharge rate) slowly and gradually.

At this time, as set out in the foregoing, the rotation rate is preferably made very slow in order to suppress disturbance factors at the surface of the grown crystal under crystal growth, namely, the rotation of the seed crystal to the minimum required. Therefore, so that the change in the size of the groove outlets of the sublimation gas discharge grooves 15 by the rotation of the crucible cover 4 even at such slow rotation is adequate to continuously change the sublimation gas flow rate, the circumferential direction width dimension of the sublimation gas discharge grooves 15 is preferably such that when the circumferential direction width dimension becomes maximum, there can be obtained a total circumferential direction width dimension of the sublimation gas discharge grooves 15 (total of the maximum width dimensions in the circumferential direction of all sublimation gas discharge grooves) that is ¼ or more of the outer circumference of the crucible cover 4. However, when this total circumferential direction width dimension of the sublimation gas discharge grooves 15 exceeds 9/10 of the outer circumference of the crucible cover 4, it sometimes becomes difficult to rotate the crucible cover 4 stably because the remaining proportion of the male threaded portion 4a engaged with the female threaded portion 3a of the crucible vessel 3 becomes small.

Figure 9B:
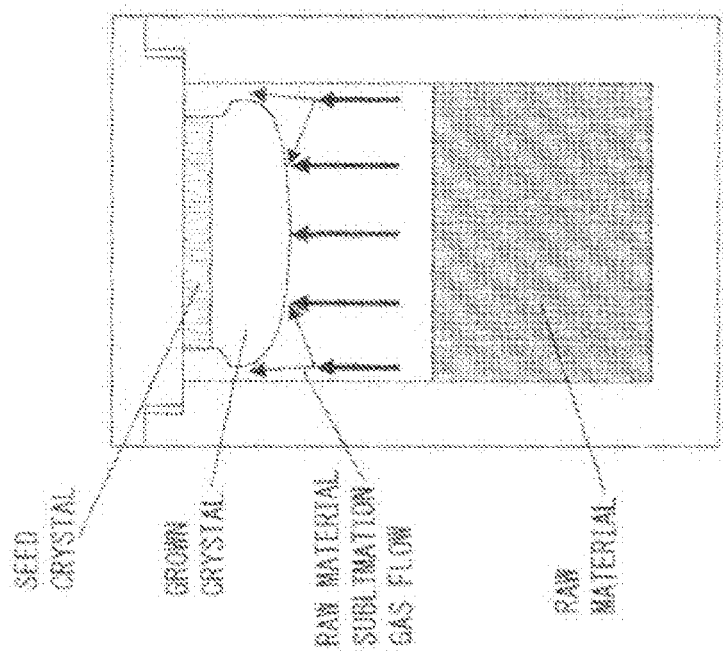
FIG. 9(b) is an explanatory view for explaining the turbulence and flow rate fluctuation of the flow of sublimation gas occurring with crystal growth when single crystal is grown using a conventional crucible for producing single-crystal silicon carbide, showing the growth from midway onward.
Figure 9A:
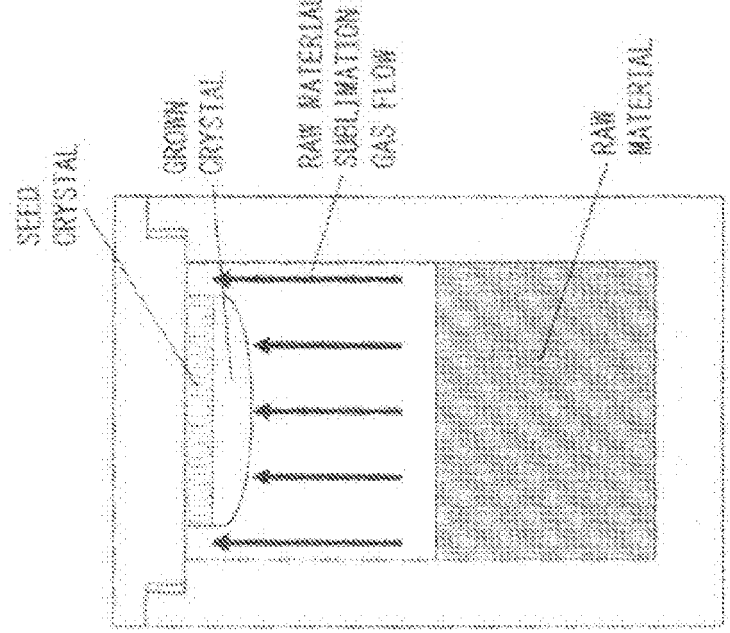
FIG. 9(a) is an explanatory view for explaining the turbulence and flow rate fluctuation of the flow of sublimation gas occurring with crystal growth when single crystal is grown using a conventional crucible for producing single-crystal silicon carbide, showing the growth at the start.

With the conventional crucible structure that merely mounts the crucible cover stationary in the crucible vessel opening (see FIG. 9(a) and FIG. 9(b)), the sublimation gas discharges through a gap spontaneously formed between the crucible cover and the crucible vessel, which makes control for fixing or arbitrarily varying the flow or flow rate of the sublimation gas impossible. In contrast, the seventh embodiment of the present invention screws the crucible vessel 3 and crucible cover 4 together by the threaded portions provided between them, forms the male threaded portion 4a of the crucible cover 4 with sublimation gas discharge grooves 15 capable of regulating flow rate by rotation relative to the female threaded portion 3a of the crucible vessel 3, and enables the sublimation gas flow rate to be varied during crystal growth by rotating the crucible cover 4 during the crystal growth process and thus controlling the opening area of the sublimation gas discharge grooves 15.

In the seventh embodiment, therefore, the increase in the sublimation gas flow rate at the middle of the grown crystal (facet region) caused by the decrease of the sublimation gas flow rate at the grown crystal periphery that occurs in a conventional crucible structure such as explained earlier using FIG. 9(b) is prevented and, as a result, disturbance of crystal growth in the vicinity of the facet can be promptly prevented and the occurrence of polytype structures different from the seed crystal, micropipe defects, polycrystallization and other such existing problems can be resolved.

Moreover, implementation of a production apparatus and production method for single-crystal silicon carbide in the manner of the seventh embodiment of the present invention results in the seed crystal being moved with respect to the silicon carbide raw material. In other words, in the case of operating in the manner of the seventh embodiment, the seed crystal gradually separates from the silicon carbide raw material as the crystal grows. In this case, if the seed crystal is moved about the same as the height of the grown crystal increases, the distance between the head of the crystal under crystal growth, namely the facet region, and the raw material surface can always be maintained constant. And this means that the effect of the heat radiation from the raw material surface to the facet region is maintained constant, so that temperature fluctuation at the facet region can be reduced to facilitate realization of stable crystal growth conditions and thus contribute to improved stable growth yield.

In addition, oppositely from the condition of "progressively increasing the sublimation gas flow rate gradually from the start of growth" as set out in the foregoing, it is also possible to maximize the sublimation gas flow rate at the start of growth and then gradually reduce the gas flow rate, and for this there are, for example, the following two methods. Specifically, one method is to form the sublimation gas discharge grooves oppositely from the case of FIG. 3(a), FIG. 3(b) and FIG. 3(c) by cutting away the screw ridge to form them in the male threaded portion of the crucible cover to narrow gradually in width dimension downward from their top ends to their bottom ends in the axial direction, by which method the opening area of the sublimation gas discharge grooves gradually narrows as the crucible cover is rotated, while another method is that of leaving the formation of the sublimation gas discharge grooves as in the case of FIG. 3(a), FIG. 3(b) and FIG. 3(c) and constituting the threaded portions so that the crucible cover is driven into the crucible vessel when the crucible cover is rotated. The difference between the two methods is that in the former the seed crystal gradually separates from the raw material (i.e., the movement is such that the head of the grown crystal remains at substantially the same position), while in the latter the movement is such that the seed crystal approaches the raw material (i.e., the distance between the head of the grown crystal and the raw material surface contracts). Speaking from ordinary thinking regarding crystal growth stabilization, the former method is superior but the latter method also offers an effect of gradually decreasing sublimation gas flow rate.

Example 1

Single-crystal silicon carbide was produced using a production apparatus for single-crystal silicon carbide shown in FIG. 6 that was equipped with the crucible A for producing single-crystal silicon carbide shown in FIG. 3(a), FIG. 3(b) and FIG. 3(c). This production apparatus enabled the double-walled quartz tube 5 to be evacuated to a high vacuum ($10^{-3}$ Pa or less) by the evacuator 13, and was adapted to enable pressure control of the internal atmosphere by Ar gas introduced through the gas flow rate regulator 12. Further, various doping gases (nitrogen, trimethylaluminum, trimethylboron) could also be introduced through the gas flow rate regulator 12, and crucible temperature measurement could be conducted by providing 2 to 4-mm diameter optical paths at the center region of the graphite thermal insulation material 7 covering the lower part of the crucible A, extracting light respectively from the upper portion and lower portion of the crucible A, and measuring the extracted light with two-color thermometers.

Further, as the seed crystal 1 was prepared a 4.5-mm diameter 4H polytype single-crystal SiC wafer having a (0001) plane and one whose offset angle had an angle of 4° from the {0001} plane was used, and this seed crystal 1 was attached to the inner surface of the crucible cover 4 of the graphite crucible.

In addition, the male threaded portion (pitch: 1 mm, screw ridge height: 0.541 mm) formed on the outer periphery of the crucible cover 4 was, as shown in FIG. 3(a), FIG. 3(b) and FIG. 3(c), machined with tapered notched grooves of 2-mm notch thickness, at four sites opposed at 90° angles and in the axial direction, from the top (crucible exterior side) to the bottom (crucible interior side) of the male threaded portion 4a of the crucible cover 4 so that the shorter width dimension was 5 mm and the longer width dimension was 21 mm, thereby forming sublimation gas discharge grooves 15 at the four sites.

SiC crystal raw material powder 2 produced by the Acheson process was charged into the graphite crucible vessel 3, the crucible cover 4 was then fully screwed into and set in the crucible vessel 3 charged with the SiC crystal raw material powder 2, which after being covered with the graphite felt thermal insulation 7 and having the graphite support rod 6 mounted on top, was placed inside the double-walled quartz tube 5. And after the inside of the double-walled quartz tube 5 had been evacuated, electric current was passed through the work coil 10 to raise the raw material temperature to 2000° C. High-purity Ar gas (purity of 99.9995%) was thereafter introduced as atmospheric gas and the internal pressure of the double-walled quartz tube 5 was maintained at 1.3 kPa throughout the crystal growth process. Under this pressure, the raw material temperature was increased from 2000° C. to the target temperature of 2400° C., whereafter crystal was grown for 45 hours while maintaining the same temperature. During this crystal growth period up to the end of the growth, nitrogen gas was passed at a flow rate of $0.5 \times 10^{-6}$ m$^3$/sec velocity (at which flow rate, the nitrogen concentration in the grown crystal became $1 \times 10^{19}$ cm$^{-3}$).

For 5 hours after the start of crystal growth, crystal of about the same diameter as the seed crystal 1 and also of similar good crystal quality was first grown on the seed crystal 1 without rotating the crucible cover 4. Thereafter, in pace with the gradual increase in the diameter of the grown crystal, the crucible cover 4 was rotated at a speed set so that the rotation speed would be ¼ turn per hour. As a result, the crucible cover 4 made 10 turns up to the end of the crystal growth. At this time, the size of the groove outlet of the sublimation gas discharge groove 15 between the crucible cover 4 and crucible vessel 3 at each of the four sites was 5 mm in width dimension and 2 mm in thickness dimension up to 5 hours from the start of the growth, while at the end of crystal growth, the size of the groove outlet of the sublimation gas discharge groove 15 at each of the four sites had expanded to 20 mm in width dimension and 2 mm in thickness dimension. The diameter of the grown crystal obtained was 51 mm and the height was about 20 mm.

When the so-obtained single-crystal silicon carbide was examined for the quality of the single-crystal obtained in twenty test runs, results reflecting stability improvement attributable to the raw material sublimation gas flow rate control were obtained, with eighteen of the twenty runs showing stable growth that was free of crystal growth disturbance and maintained the same crystal polytype throughout the growth, while the growth test run yield indicated a good value of 90%.

Example 2

Further, the same test as in Example 1 was conducted but instead of the crucible A of the second embodiment (FIG. 3(a), FIG. 3(b) and FIG. 3(c)) used in Example 1 there was used a crucible A having sublimation gas discharge grooves 15 at four sites formed in the female threaded portion 3a of the crucible vessel 3 shown in FIG. 5(b) by the same notched groove machining as in the case of Example 1. The shape and size of the tapered notches were exactly the same as when formed in the male threaded portion 4a of the crucible cover 4 in Example 1, but the shorter width dimension was at the bottom of the female threaded portion 3a of the crucible vessel 3 and the longer width dimension was on the inlet side of the female threaded portion 3a of the crucible vessel 3. Good results were obtained: the quality of the single-crystal silicon carbide obtained was the same as set out above and the yield was 90%.

Example 3

The same test as in Example 1 was conducted except that instead of the crucible A of the second embodiment (FIG. 3(a), FIG. 3(b) and FIG. 3(c)) used in Example 1, there was used a crucible A such as shown in FIG. 1, FIG. 2(a), FIG. 2(b) and FIG. 2(c) of the first embodiment and the growth time was made 60 hours. Here, the male threaded portion 4a (pitch: 2 mm, screw ridge height: 1.083 mm) of the crucible cover 4 was provided with sublimation gas discharge grooves 15 of 5 mm width dimension and 2 mm depth dimension at five sites equally spaced in the circumferential direction thereof.

In this Example 3, for 4.5 hours after the start of crystal growth, crystal of about the same diameter as the seed crystal and also of similar good crystal quality was first grown on the seed crystal 1 without rotating the crucible cover 4. Thereafter, the rotation speed of the crucible cover 4 was set at a speed to make ⅙ turn per hour, and the crucible cover 4 was rotated for 1.5 hours to raise the crucible cover 4 until the sublimation gas discharge grooves 15 appeared. The aforesaid opening state of the sublimation gas discharge grooves 15 was maintained up to the end of the crystal growth. The diameter of the crystal obtained was 51 mm and the height was about 20 mm.

When the so-obtained single-crystal silicon carbide was examined for the quality of the single-crystal obtained in twenty test runs, results reflecting stability improvement attributable to the raw material sublimation gas flow rate control were obtained, with seventeen of the twenty runs showing stable growth that was free of crystal growth disturbance and maintained the same crystal polytype throughout the growth, while the growth test run yield indicated a good value of 75%.

Example 4

Further, the same test as in Example 1 was conducted but instead of the crucible A of the second embodiment (FIG. 3(a), FIG. 3(b) and FIG. 3(c)) used in Example 1 there was used a crucible A having sublimation gas discharge grooves 15 at five sites formed in the female threaded portion 3a of the crucible vessel 3 shown in FIG. 5(a) by the same tapered notched groove machining as in the case of Example 3. The shape and size of the notch machining were the same as when formed in the male threaded portion 4a of the crucible cover 4 in Example 3, but the notch opening was formed from the inlet side of the female threaded portion 3a of the crucible vessel 3. Good results were obtained: the quality of the single-crystal silicon carbide obtained was the same as set out above and the yield was 75%.

Example 5

The same test as in Example 1 was conducted except that instead of the crucible A of the second embodiment (FIG. 3(a), FIG. 3(b) and FIG. 3(c)) used in Example 1, there was used a crucible A such as shown in FIG. 4(a), FIG. 4(b) and FIG. 4(c) of the third embodiment and the growth time was made 60 hours. Here, the male threaded portion 4a (pitch: 2 mm, screw ridge height: 1.083 mm) of the crucible cover 4 was provided with sublimation gas discharge grooves 15 in three width dimension stages of 5 mm, 10 mm and 20 mm, and depth dimension of 2 mm, at four sites equally spaced in the circumferential direction thereof.

For 4.5 hours after the start of crystal growth, crystal of about the same diameter as the seed crystal 1 and also of similar good crystal quality was first grown on the seed crystal 1 without rotating the crucible cover 4. Thereafter, the rotation speed of the crucible cover 4 was set at a speed to make ⅙ turn per hour, and the crucible cover 4 was rotated for 1.5 hours to raise the crucible cover 4 until the sublimation gas discharge grooves 15 appeared, whereafter it was rotated up to the end of crystal growth with the rotation speed maintained. As a result, the crucible cover 4 made 10 turns up to the end of the crystal growth. The diameter of the grown crystal obtained was 51 mm and the height was about 20 mm.

When the so-obtained single-crystal silicon carbide was examined for the quality of the single-crystal obtained in twenty test runs, results reflecting stability improvement attributable to the raw material sublimation gas flow rate control were obtained, with seventeen of the twenty runs showing stable growth that was free of crystal growth disturbance and maintained the same crystal polytype throughout the growth, while the growth test run yield indicated a good value of 85%.

Example 6

Further, the same test as in Example 1 was conducted but instead of the crucible A of the second embodiment (FIG. 3(a), FIG. 3(b) and FIG. 3(c)) used in Example 1 there was used a crucible A having sublimation gas discharge grooves 15 at four sites formed in the female threaded portion 3a of the crucible vessel 3 shown in FIG. 5(c) by the same notched groove machining as in the case of Example 5. The shape and size of the notch machining were the same as when formed in the male threaded portion 4a of the crucible cover 4 in Example 5, but the notch width narrowed from the inlet side of the female threaded portion 3a of the crucible vessel 3 in the order of 20 mm, 10 mm and 5 mm. Good results were obtained: the quality of the single-crystal silicon carbide obtained was the same as set out above and the yield was 85%.

Comparative Example 1

Crystal growth was conducted as in the Example 1 except that a crucible of conventional structure, as in FIG. 9(a), whose crucible vessel and crucible cover were not screwed together was used as the crucible A.

When the so-obtained single-crystal silicon carbide was examined for the quality of the single-crystal obtained in twenty test runs, results were obtained that reflected instability arising because the raw material sublimation gas flow rate was not controlled, with eleven of the twenty runs experiencing crystal growth disturbance (crystallinity degradation accompanying occurrence of foreign crystal polytypes), while the growth test run yield indicated a low value of 45%.

Comparative Example 2

Crystal growth was conducted as in the Example 1 except that the opening area of the sublimation gas discharge grooves 15 was maintained at the same size from start to end, without rotating the crucible cover 4.

When the so-obtained single-crystal silicon carbide was examined for the quality of the single-crystal obtained in twenty test runs, results were obtained that reflected instability arising because the raw material sublimation gas flow rate was not controlled, with nine of the twenty runs experiencing crystal growth disturbance (crystallinity degradation accompanying occurrence of foreign crystal polytypes), while the growth test run yield indicated a low value of 55%.

EXPLANATION OF REFERENCE SYMBOLS

1 . . . Seed crystal (single-crystal SiC), 2 . . . SiC crystal powder raw material, 3 . . . Crucible vessel, 3(a) . . . Female threaded portion, 4 . . . Crucible cover, 4a Male threaded portion, 5 . . . Double-walled quartz tube, 6 . . . Support rod, 7 . . . Thermal insulation material (graphite felt), 8 . . . Shaft for rotational driving, 9 . . . Drive motor, 10 . . . Work coil, 11 . . . Gas piping, 12 . . . Gas flow rate regulator, 13 . . . Evacuator.

The invention claimed is:

1. A crucible for producing single-crystal silicon carbide, comprising:
a crucible vessel and a crucible cover, wherein
the crucible cover is configured for the attachment of a seed crystal to the crucible cover; and
the crucible vessel is configured to hold a silicon carbide raw material in the crucible vessel and sublimate the silicon carbide raw material to supply silicon carbide sublimation gas onto a seed crystal attached to the crucible cover, thereby growing single-crystal silicon carbide on the seed crystal, and wherein
the crucible vessel and the crucible cover each comprise threaded portions, configured to screw the crucible vessel and the crucible cover together, the threaded portion of the crucible vessel and/or the crucible cover comprising a sublimation gas discharge groove or grooves configured to regulate the sublimation gas flow rate by relative rotation of the threaded portions,
wherein the sublimation gas discharge groove or grooves in the threaded portion of the crucible vessel and/or crucible cover have an opening area, and comprise a groove outlet side and a groove inlet side, wherein the opening area changes from the groove outlet side to the groove inlet side.

2. The crucible for producing single-crystal silicon carbide as set out in claim 1, wherein the sublimation gas discharge groove or grooves in the threaded portion of the crucible vessel and/or crucible cover open along the circumferential direction of the threaded portion, and the total length of the longest portion of the opening width of the sublimation gas discharge groove or grooves is not less than ¼ to not greater than 9/10 the threaded portion perimeter length.

3. A production apparatus for single-crystal silicon carbide, the apparatus comprising:
a crucible comprising:
a crucible vessel and a crucible cover, wherein
the crucible cover is configured for the attachment of a seed crystal to the crucible cover; and
the crucible vessel is configured to hold a silicon carbide raw material in the crucible vessel and sublimate the silicon carbide raw material to supply silicon carbide sublimation gas onto a seed crystal attached to the crucible cover, thereby growing single-crystal silicon carbide on the seed crystal, and wherein
the crucible vessel and the crucible cover each comprises threaded portions, configured to screw the crucible vessel and the crucible cover together, the threaded portion of the crucible vessel and/or the crucible cover comprising a sublimation gas discharge groove or grooves configured to regulate the sublimation gas flow rate by relative rotation of the threaded portions and a threaded portion driver for imparting relative rotation to the threaded portions,
wherein the sublimation gas discharge groove or grooves in the threaded portion of the crucible vessel and/or crucible cover have an opening area, and comprise a groove outlet side and a groove inlet side, wherein the opening area changes from the groove outlet side to the groove inlet side.

4. A method for producing single-crystal silicon carbide using the production apparatus of claim 3, comprising:
subliming a silicon carbide raw material in a crucible vessel, thereby producing a silicon carbide sublimation gas,
depositing silicon carbide from the silicon carbide sublimation gas onto a seed crystal attached to a crucible cover screwed onto the crucible vessel, and growing single-crystal silicon carbide on the seed crystal, wherein the discharge rate of sublimation gas to outside the crucible is varied during the single-crystal silicon carbide growth process.

5. The method for producing single-crystal silicon carbide as set out in claim 4, further comprising gradually increasing the discharge rate of the sublimation gas from the crucible with crystal growth.

6. The crucible for producing single-crystal silicon carbide as set out in claim 1, wherein the sublimation gas discharge groove or grooves in the threaded portion of the crucible vessel and/or crucible cover open along the circumferential direction of the threaded portion and the total length of the longest portion of the opening width thereof is not less than ¼ to not greater than 9/10 the threaded portion perimeter length.

* * * * *